United States Patent
Cherko

(12) 
(10) Patent No.: US 6,203,614 B1
(45) Date of Patent: Mar. 20, 2001

(54) CABLE ASSEMBLY FOR CRYSTAL PULLER

(75) Inventor: Carl F. Cherko, St. Charles, MO (US)

(73) Assignee: MEMC Electronic Materials, Inc., St. Peters, MO (US)

( * ) Notice: Subject to any disclaimer, the term of this patent is extended or adjusted under 35 U.S.C. 154(b) by 0 days.

(21) Appl. No.: 09/322,824

(22) Filed: May 28, 1999

(51) Int. Cl.$^7$ .................................................. C30B 15/32
(52) U.S. Cl. .......................... 117/208; 117/218; 117/911
(58) Field of Search .................... 117/206, 911, 117/208, 218

(56) References Cited

U.S. PATENT DOCUMENTS

| | | | |
|---|---|---|---|
| 4,167,554 | * | 9/1979 | Fisher .................................. 422/246 |
| 5,126,113 | * | 6/1992 | Yamagishi et al. ................... 422/249 |
| 5,135,727 | * | 8/1992 | Ibe ....................................... 422/249 |
| 5,173,270 | * | 12/1992 | Kida et al. ........................... 422/249 |
| 5,833,750 | | 11/1998 | Mizuishi et al. ..................... 117/218 |
| 5,888,298 | * | 3/1999 | Yanagimachi et al. .............. 117/200 |
| 5,902,397 | * | 5/1999 | Schulman et al. .................... 117/200 |
| 5,911,821 | * | 6/1999 | Iino et al. ............................... 117/13 |
| 5,938,843 | * | 8/1999 | Hiraishi et al. ....................... 117/218 |
| 5,948,164 | * | 9/1999 | Iida et al. ............................. 117/218 |
| 6,015,461 | * | 1/2000 | Izumi ................................... 117/218 |

FOREIGN PATENT DOCUMENTS

| | | | |
|---|---|---|---|
| 0783047 | 7/1997 | (EP) | .............................. C30B/15/32 |
| 2562915 | 10/1985 | (FR) | .............................. C30B/15/30 |
| 04182381 | 6/1992 | (JP) | .............................. C30B/15/32 |
| 4182382 | 6/1992 | (JP) | .............................. C30B/15/32 |
| 7010687 | 1/1995 | (JP) | .............................. C30B/15/32 |

OTHER PUBLICATIONS

International Search Report, 8/21/00.

* cited by examiner

*Primary Examiner*—Benjamin Utech
*Assistant Examiner*—Matthew Anderson
(74) *Attorney, Agent, or Firm*—Senniger, Powers, Leavitt & Roedel

(57) ABSTRACT

A cable assembly for supporting a seed chuck in a crystal puller to grow monocrystalline ingots according to the Czochralski method comprises a cable adapted for generally vertical movement within the crystal puller relative to a source of molten material. A chuck support is connected to an end of the cable within the crystal puller and is configured for supporting the seed chuck. The chuck support is constructed of a refractory material having a high creep rupture strength and comprises an elongate shank having an upper end and a lower end and an enlarged end member at the lower end of the shank. A coupling is constructed of a malleable material and is deformable into engagement with the end of the cable and the upper end of the shank to join the chuck support to the cable. The elongate shank spaces the coupling from the enlarged end member of the chuck support so that during operation of the crystal puller the coupling is substantially further above the molten source material than the chuck support as the cable assembly pulls the growing ingot upward within the crystal puller.

13 Claims, 4 Drawing Sheets

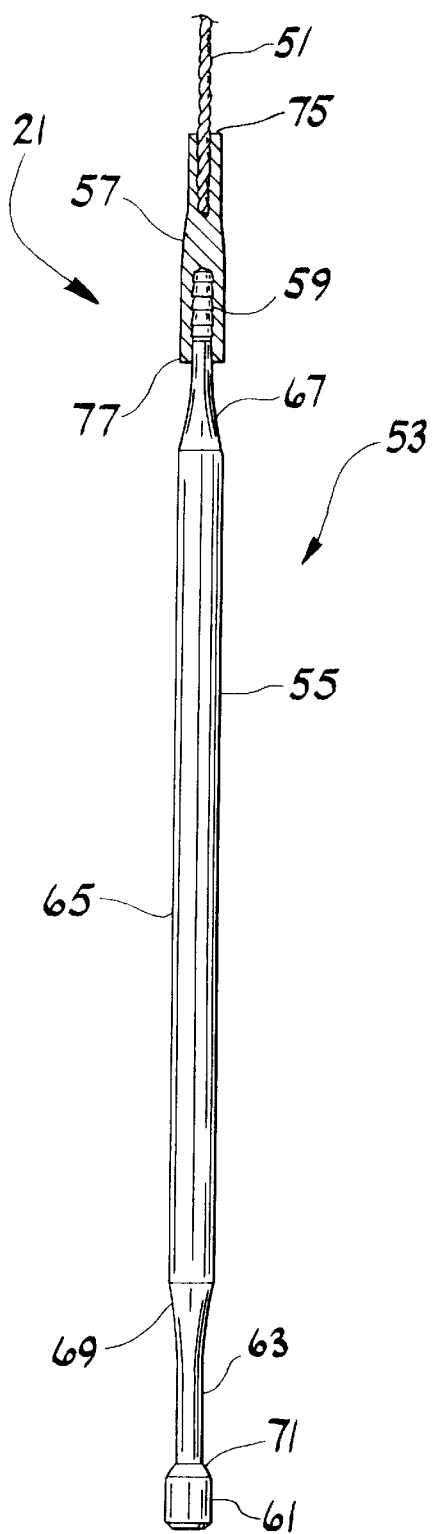
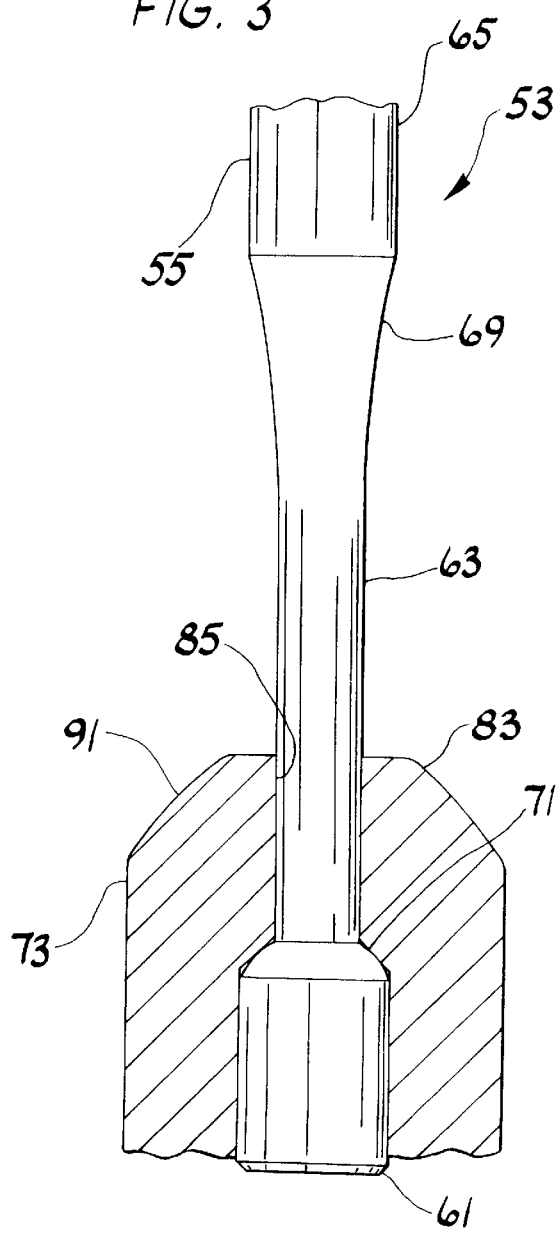

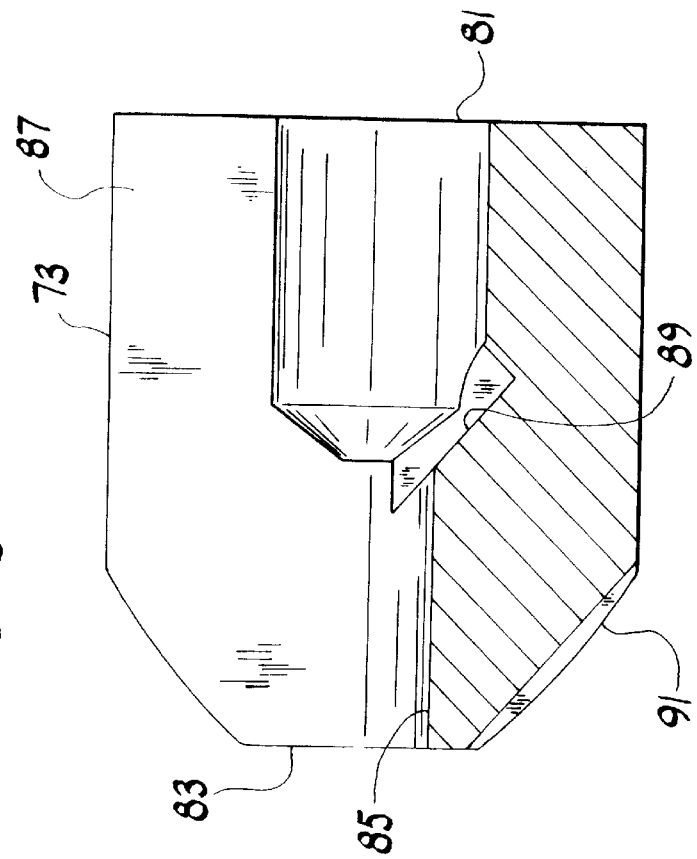
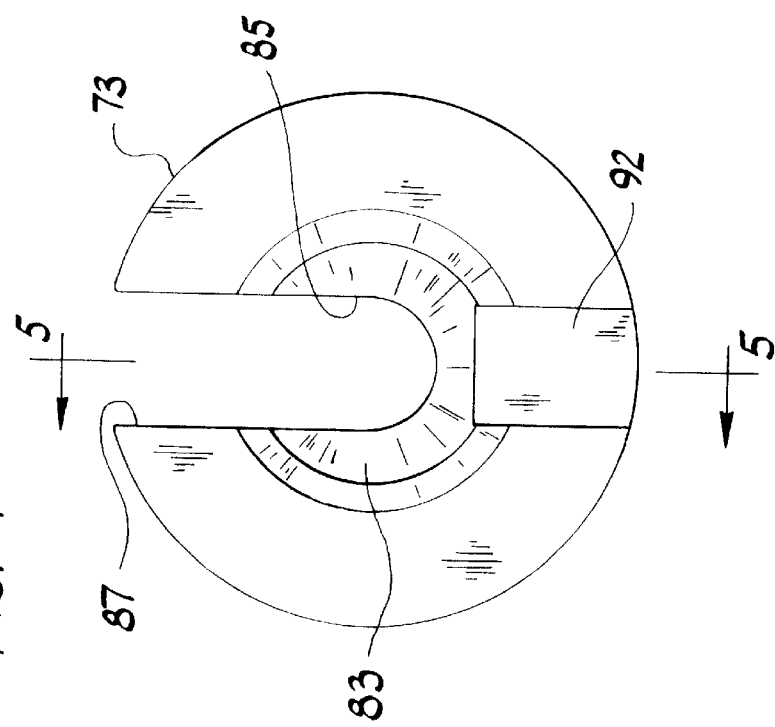

CABLE ASSEMBLY FOR CRYSTAL PULLER

BACKGROUND OF THE INVENTION

The present invention relates generally to crystal growing apparatus used in growing monocrystalline ingots, and more particularly to a cable assembly for use in such crystal growing apparatus.

Single crystal silicon, which is the starting material for most semiconductor electronic component fabrication, is commonly prepared by the so-called Czochralski ("Cz") method. The growth of a crystal ingot is most commonly carried out in a crystal pulling furnace or crystal puller. In this method, polycrystalline silicon ("polysilicon") is charged to a crucible and melted by a heater surrounding the outer surface of the crucible side wall. A cable assembly comprised of a shank and a cable wound on a drum supports a seed chuck capable of holding a seed crystal therein. The seed crystal is brought into contact with the molten silicon and a single crystal ingot is grown by slow extraction via the cable assembly. After formation of a neck is complete, the diameter of the crystal ingot is enlarged by decreasing the pulling rate and/or the melt temperature until the desired or target diameter is reached. The cylindrical main body of the crystal which has an approximately constant diameter is then grown by controlling the pull rate and the melt temperature while compensating for the decreasing melt level. Near the end of the growth process, the crystal diameter must be reduced gradually to form an end-cone. Typically, the end-cone is formed by increasing the pull rate and heat supplied to the crucible. When the diameter becomes small enough, the ingot is then separated from the melt.

Conventional cable assemblies used in crystal pullers comprise a tungsten cable and a chuck support constructed of a malleable material, such as a non-magnetic austenitic stainless steel or a malleable tungsten alloy. The chuck support includes a shank swaged to the end of the cable extending within the crystal puller and a ball, sized larger than the shank, attached to the end of the shank opposite the cable. The chuck support is malleable so that the shank can be swaged on the end of the cable to connect the chuck support to the cable. The seed chuck is supported by the ball of the chuck support and hangs down therefrom such that the ball of the chuck support carries the weight of the seed chuck and growing ingot. The weight is then distributed up the shank to the cable.

Recent advances in crystal puller design and semiconductor wafer processing have led to more severe mechanical and thermal loads on the cable assembly. The creep rupture strength of the material used to form the chuck support is not sufficiently great to withstand the environment in the new puller. The chuck support tends to fail at the crosssection between the ball and the shank at mechanical and thermal loads well below loads that would cause the tungsten cable to fail. The chuck support has thus become the limiting factor in the usage lifetime of the cable assembly for growing silicon ingots. More particularly, the lifetime of the conventional cable assembly has been cut in half, from being useful in growing about twenty ingots down to being used in the growth of only about ten silicon ingots. The thickness of the shank cannot be increased to overcome this limitation because the shank must remain sufficiently malleable for swaging to the cable to form a strong joint. For similar reasons, the conventional chuck support cannot be constructed of near pure tungsten, which has a higher creep rupture strength under the severe thermal loading within the crystal puller, because it is not sufficiently malleable for swaging the shank to the cable.

SUMMARY OF THE INVENTION

Among the several objects of this invention are the provision of an improved cable assembly capable of withstanding increased mechanical and thermal loads in a crystal puller; the provision of such a cable assembly having an increased usage lifetime; the provision of such a cable assembly having an increased creep rupture strength; the provision of such a cable assembly in which loads are distributed more uniformly, or coaxially, throughout the assembly, and the provision of such a cable assembly which can be monitored for axial deformation such as creep flow or pullout.

Generally, a cable assembly of the present invention for supporting a seed chuck in a crystal puller to grow monocrystalline ingots according to the Czochralski method comprises a cable adapted for generally vertical movement within the crystal puller relative to a source of molten material. A chuck support is connected to an end of the cable within the crystal puller and is configured for supporting the seed chuck. The chuck support is constructed of a refractory material having a high creep rupture strength and comprises an elongate shank having an upper end and a lower end and an enlarged end member at the lower end of the shank. A coupling is constructed of a malleable material and is deformable into engagement with the end of the cable and the upper end of the shank to join the chuck support to the cable. The elongate shank spaces the coupling from the enlarged end member of the chuck support so that during operation of the crystal puller the coupling is substantially further above the molten source material than the chuck support as the cable assembly pulls the growing ingot upward within the crystal puller.

Other objects and features of the present invention will be in part apparent and in part pointed out hereinafter.

BRIEF DESCRIPTION OF THE DRAWINGS

FIG. 2 is an elevation of a cable, coupling and chuck support of the cable assembly of FIG. 1 with portions of the assembly being shown in section;

FIG. 3 is a greatly enlarged, fragmented elevation of the cable with an insert used in supporting the seed chuck on the cable assembly shown in section;

FIG. 4 is a top plan view of the insert;

FIG. 5 is a section taken along the line 5—5 in FIG.4; and

Corresponding reference characters indicate corresponding parts throughout the several views of the drawings.

DETAILED DESCRIPTION OF THE PREFERRED EMBODIMENTS

Figure 1:
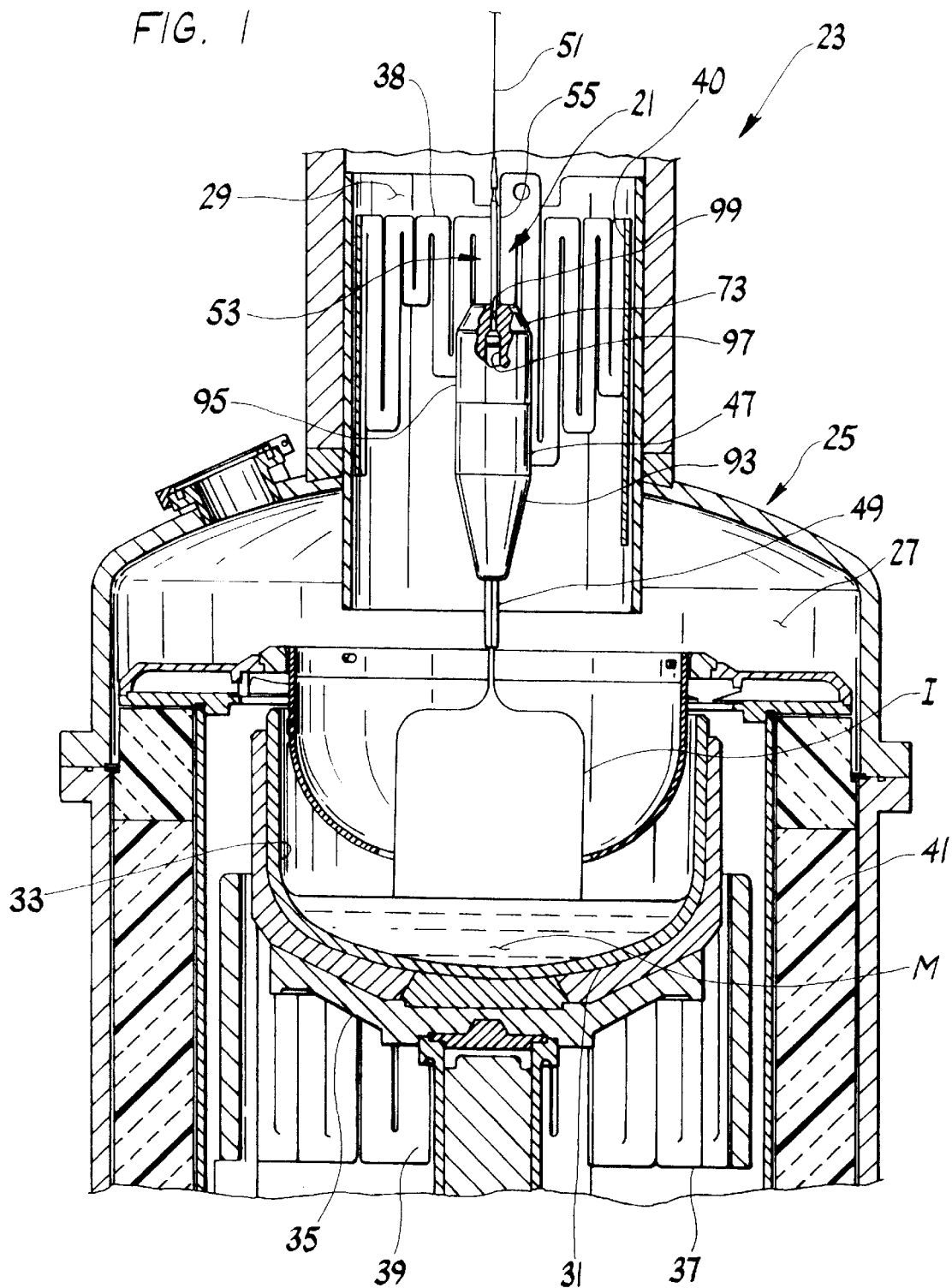
FIG. 1 is a vertical section of a crystal puller incorporating a cable assembly of the present invention.

Referring now to the drawings and in particular to FIG. 1, a cable assembly constructed according to the principles of the present invention is generally indicated at 21. The cable assembly 21 is preferably for use in a crystal puller, indicated generally at 23, of the type used to grow monocrystalline silicon ingots (e.g., ingot I of FIG. 1) according to the Czochralski method. The crystal puller 23 includes a housing (generally indicated at 25) for isolating an interior which includes a lower crystal growth chamber 27 and an upper pull chamber 29. The pull chamber 29 has a smaller transverse dimension than the growth chamber. A quartz crucible 31 contains molten semiconductor source material M (e.g., silicon) from which the monocrystalline ingot I is grown. The crucible 31 includes a cylindrical side wall 33 and is mounted on a turntable 35 for rotation about a vertical axis. The crucible 31 is also capable of being raised within the growth chamber 27 to maintain the surface of the molten source material M at the same level as the ingot I is grown and source material is removed from the melt.

A crucible heater, generally indicated at 37, for melting the source material M in the crucible 31 includes a generally vertically oriented heating element 39 surrounding the crucible in radially spaced relationship with the side wall 33 of the crucible. The heating element 39 heats the crucible 31 and the interior of the crystal puller housing 25 to temperatures above the melting point of the source material M. Insulation 41 is positioned to confine the heat to the interior of the housing 25. In addition, there are passages (not shown) in the housing 25, including in the wall of the upper pull chamber, for circulation of cooling water.

A second, or upper heater 38 constructed in a manner similar to the crucible heater 37 is mounted in the upper pull chamber 29 of the housing 25 adjacent the dome-shaped upper wall of the lower growth chamber 27. The heater 38 extends downward into the crystal growth chamber 27, terminating substantially above the crucible 31 containing the molten source material M. A central opening 40 of the heater allows the growing ingot I to pass centrally through the heating element as it is pulled upward through the housing 25 of the puller 23.

The cable assembly 21 of the present invention includes a cable 51, a chuck support, generally indicated at 53, connected to an end of the cable extending within the crystal puller 23, and a coupling 57 connecting the chuck support to the cable. The cable 51 extends down from a pulling mechanism (not shown) disposed above the pull chamber 29 capable of raising, lowering the cable along a vertical axis X, and rotating the cable coaxially about the vertical axis. The cable 51 is preferably constructed from wound strands of near pure tungsten (e.g., 99.95% purity) to provide high creep rupture strength to the cable within the severe thermal environment in the crystal puller 23. Tungsten is known as having the highest melting point of refractory metals. In the illustrated embodiment, the cable 51 has a diameter of 0.0984 inches (2.5 mm). A seed crystal chuck 47 which holds a seed crystal 49 used to grow the monocrystalline ingot I is suspended from the lower end of the cable 51 within the crystal puller by the chuck support. The cable has been partially broken away in FIG. 1 for clarity in illustration of a raised position of the seed chuck 47 and ingot I. The general construction and operation of the crystal puller 23, except to the extent explained more fully below, is well known to those of ordinary skill in the art and will not be further described.

With reference to FIG. 2, the chuck support 53 of the cable assembly 21 comprises a shank 55 and an enlarged end member 61 attached to a lower end 63 of the shank. In the illustrated embodiment, a central portion 65 of the shank 55 has a diameter of approximately 0.344 inches. The diameter of the shank 55 gradually decreases from the central portion 65 toward the upper and lower ends 59, 63 of the shank 55 to define tapered shoulders 67, 69. The reduced diameter of the upper and lower ends 59, 63 of the shank is approximately 0.19 inches. It is understood that the diameter of the upper end 59 of the shank 55 may be different from the diameter of the lower end 63 of the shank without departing from the scope of this invention. The overall length of the shank 55 is preferably at least 10 inches, and more preferably about 11.13 inches. This is substantially longer than shanks (not shown) of conventional cable assemblies, which have a shank length of about 0.5 inches. The surface of the upper end 59 of the shank 55 is barbed or otherwise roughened for use in swaging the coupling 57 to the shank to form a sufficiently strong connection.

Referring to FIG. 3, the enlarged end member 61 of the chuck support 53 is generally cylindrical. The diameter of the end member 61 is substantially greater than the diameter of the lower end 63 of the shank 55 for purposes which will become apparent. In the illustrated embodiment, the diameter of the end member 61 is about 0.344 inches, which is identical to the diameter of the central portion 65 of the shank 55. The upper end of the end member 61 is generally frusto-conical to define a tapered seat 71 for seating an insert 73 used in connecting the seed chuck 47 to the chuck support 53. The tapered seat 71 of the end member 61 is slightly curved rather than a straight taper. The shank 55 and enlarged end member 61 are preferably integrally formed by being machined from a solid rod of near pure tungsten, such as about 99.95% pure tungsten, which is the same material used in construction of the cable. It is also contemplated that the enlarged end member 61 may be ball-shaped as in conventional cable assemblies or constructed to have other suitable shapes without departing from the scope of this invention.

The coupling 57 is generally tubular and is constructed of a malleable material such as 316 stainless steel, a malleable tungsten alloy or other suitable material. The coupling 57 is swaged at one end 75 to the cable 51 and is swaged at its other end 77 to the barbed upper end 59 of the shank 55 such that the enlarged end member 61 extends down within the crystal puller 23 substantially below the coupling in coaxial alignment with the vertical axis X of the cable. Swaging the coupling 57 to the upper end 59 of the shank 55 causes the malleable material from which the coupling is constructed to displace into the recesses formed by the barbed surface of the shank upper end to provide a strong interlocking joint therebetween. A similar joint is provided by swaging the coupling 57 to the cable 51 in that the coupling material deforms into the recesses defined by the wound strands of the cable.

The insert 73 that seats over the enlarged end member 61 of the chuck support 53 is generally cup-shaped, having an open lower end 81 and a substantially closed upper end 83. The upper end 83 of the insert 73 has a centrally disposed opening 85 therein sized to permit throughpassage of the lower end 63 of the shank 55. The inner diameter of the insert 73 is sized slightly larger than the diameter of the enlarged end member 61 for receiving the end member into the insert such that the insert seats down over the end member. The inner diameter of the insert 73 gradually decreases toward the upper end 83 of the insert generally in accordance with the tapered seat 71 of the end member 61 of the chuck support 53. In the illustrated embodiment, the taper of the inner diameter of the insert 73 is generally a straight taper such that contact between the insert and the end member 61 of the chuck support 53 is limited generally to the crown of the curved tapered seat 71 of the end member. This provides a more consistent contact between the insert 73 and end member 61 to promote more uniform distribution of mechanical loading, such as from the weight of the seed chuck 47 and growing ingot I, from the insert to the chuck support 53. The curved tapered seat 71 of the end member 61 also retains some of the self-alignment capability of the insert 73 on the chuck support 53 typically associated with conventional ball-shaped end members.

As shown in FIG. 4, a radial slot 87 extends along the length of the insert 73 generally from the bottom of the insert to the centrally located opening 85 at the top of the insert. The slot 87 is sufficiently wide to permit throughpassage of the lower end 63 of the chuck support shank 55 when placing the insert 73 onto the end member 61 of the chuck support 53. As an example, the slot 87 of the illustrated embodiment has a radial width of approximately 0.210 inches. The opening 85 at the top of the insert 73 is of a diameter larger than the diameter of the lower end 63 of the shank 55, but substantially smaller than the diameter of the enlarged end member 61 such that the enlarged end member retains the insert on the chuck support 53. The length of the end member 61 of the chuck support 53 is sufficient to extend down within the insert 73 substantially the entire length of the insert for stabilizing the insert on the end member against rolling off or otherwise falling off of the chuck support during assembly of the cable assembly 21. A relief notch 89 is formed within the insert 73 opposite the slot 87 and has a width substantially equal to the width of the slot so that the tapered seat 71 of the chuck support end member 61 is free from engagement by the insert along the width of the relief notch as well as along the width of the slot. The surface contact between the insert 73 and the end member 61 is thus symmetric, e.g., opposing segments extending intermediate the slot 87 and the relief notch 89. In this manner, mechanical loading transferred from the insert 73 to the chuck support end member 61 is distributed symmetrically about the chuck support such that loading of the cable 51 occurs in generally coaxial relationship with the vertical axis X of the cable to inhibit bending stresses in the shank 55 and further to inhibit undesirable orbiting of the chuck support 53 about the vertical axis X of the cable caused by the chuck support being slightly bent or otherwise laterally deformed due to non-coaxial loading.

As shown in FIGS. 3 and 5, an outer diameter of the insert 73 also gradually decreases toward the top of the insert to define a tapered seat 91 for seating the seed chuck 47 on the insert. In the illustrated embodiment, the tapered seat 91 is generally curved in a manner similar to the tapered seat 71 of the enlarged end member 61 of the chuck support 53. The seed chuck 47 comprises a body 93 capable of holding the seed 49 therein and an adapter 95 releasably connected to the body for connecting the seed chuck to the cable assembly 21. The adapter 95 of the seed chuck 47 has an internal insert chamber 97 sized for receiving the insert 73 into the adapter to couple the adapter to the chuck support 55. The diameter of the insert chamber 97 gradually decreases toward its upper end generally in accordance with the tapered seat 91 of the insert 73. The taper of the insert chamber 97 is preferably a straight taper such that contact between the adapter 95 and the insert 73 is limited generally to the crown of the convex surface of the tapered seat 91 the insert. This provides a more predictable contact surface between the adapter 95 and the insert 73 to promote more uniform distribution of mechanical loading, such as the weight of the seed chuck 47 and growing ingot I, from the seed chuck to the insert. An internal bore 99 having a diameter slightly larger than the diameter of the central portion 65 of the shank 55 and the enlarged end member 61 extends longitudinally from the insert chamber 97 to the top of the adapter 95 to permit throughpassage of the shank 55 when the insert 73 and enlarged end member of the chuck support 53 are disposed in the insert chamber of the seed chuck 47. Another relief notch 92 (FIG. 4) is formed in the tapered seat 91 of the insert 73 and has a width substantially the same as the width of the slot 87. Similar to the relief notch 89, this second relief notch promotes synmmetric loading between the adapter 95 and the insert 73.

In a preferred method of assembling the cable assembly 21 of the present invention, the adapter 95 of the seed chuck 47 is separated from the seed chuck body 93 to provide access to the insert chamber 97 within the adapter. The chuck support 53 is connected to the cable 51 by swaging the upper end 75 of the coupling 57 to the cable and then swaging the lower end 77 of the coupling to the upper end 59 of the shank 55. The order of swaging may of course be reversed without departing from the scope of this invention. The adapter 95 is placed on the chuck support 53 by pushing it upward over the enlarged end member 61 such that the enlarged end member and lower end 63 of the shank 55 extend through the internal bore 99 adjacent the top of the adapter and into the insert chamber 97 of the adapter. The adapter 95 is then pushed further upward along the lower end 63 of the shank 55, until the insert 73 can be placed on the chuck support 53 with the lower end of the shank passing through the slot 87 in the insert. The insert 73 is then guided down along the lower end 63 of the shank 55 until the insert receives the end member 61 therein and seats down on the tapered seat 71 of the end member. The adapter 95 is then guided back down along the shank 55 until the adapter seats down on the tapered seat 91 of the insert such that the insert is fully enclosed within the insert chamber 97 of the adapter. The body 93 of the seed chuck 47 is then connected to the seed chuck adapter 95 and a seed crystal 49 is placed in the seed chuck body in a conventional manner.

Figure 6:
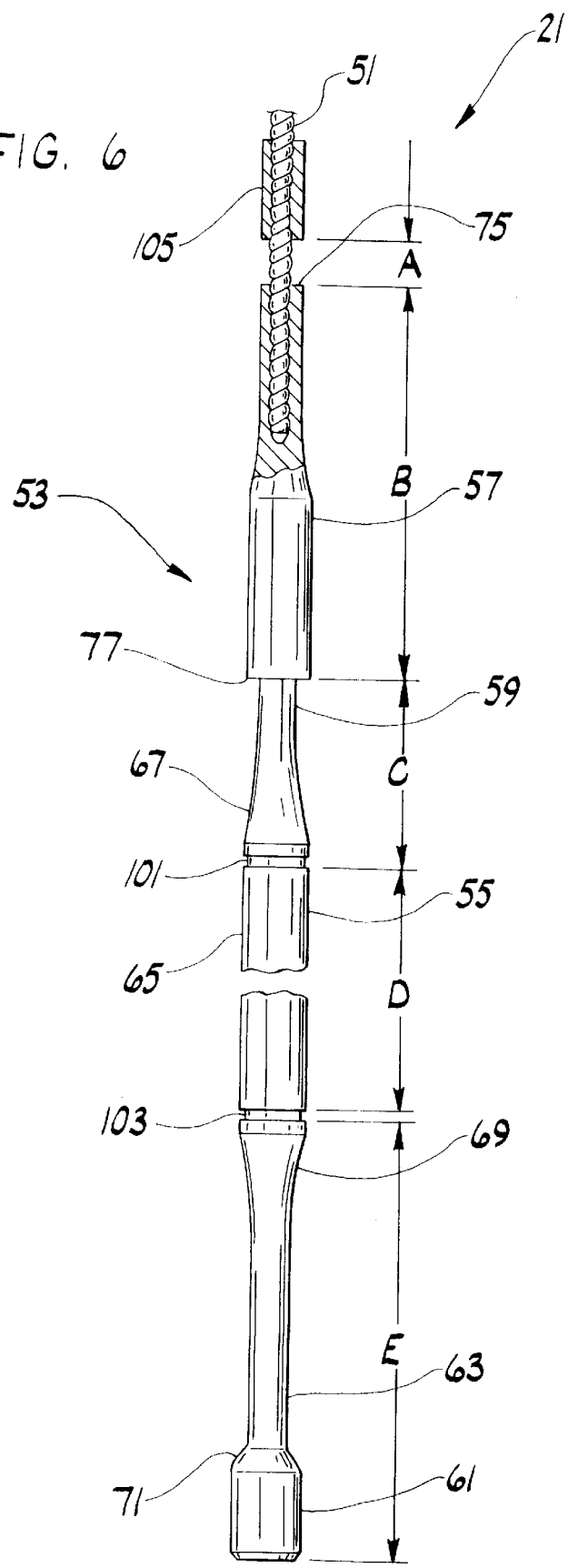
FIG. 6 is an elevation of a second embodiment of a cable, coupling and chuck support incorporating a monitoring system of the present invention for monitoring axial displacement of one or more segments of the cable assembly during the usage lifetime of the assembly.

FIG. 6 illustrates a second embodiment of a cable assembly of the present invention incorporating a monitoring system for periodically monitoring axial deformation (e.g, creep flow or other axial displacement, such as cable or chuck support pullout from the coupling) during the usage lifetime of the cable assembly 21. The structure of this second embodiment is substantially similar to the structure of the first embodiment of FIGS. 1–5, and is therefore identified by the same numbers. A pair of annular grooves 101, 103 are formed in the central portion 65 of the chuck support shank 55 in predetermined, longitudinally spaced relationship. A collar 105 is swaged to the cable 51 at a predetermined distance above the coupling 57 of the chuck support 53. The distances indicated as A–E are then measurable, such as by conventional calipers (not shown), between ingot growth cycles. For example, measurement A, the distance between the bottom of the swaged collar 105 and the top of the chuck support coupling 57, monitors pullout of the cable 51 from the chuck support coupling. Measurement B, the distance between top and bottom of the coupling 57, monitors axial creep flow of the coupling. Measurement C, the distance between the bottom of the coupling 57 and the upper groove 101 in the central portion 65 of the shank 55, monitors pullout of the shank from the coupling. Measurement D, the distance between the upper and lower annular grooves 101, 103 on the central portion 65 of the shank 55, monitors axial creep flow of the central portion of the shank. Measurement E, the distance between the lower groove 103 on the central portion 65 of the shank 55 and the bottom of the enlarged end member 61, monitors axial creep flow of the lower end 63 of the shank. Periodic monitoring of the creep flow of the cable assembly 21 can detect any excessive axial deformation in the assembly before any particular portion of the assembly reaches a high risk of failure.

In view of the above, it will be seen that the several objects of the invention are achieved and other advantageous results attained. By using a coupling 57 constructed of a malleable material to attach the shank 55 to the tungsten cable 51, the entire shank and enlarged end member 61 of the chuck support 53 may be constructed of a material, such as near pure tungsten, having a high creep rupture strength. The ability of the shank 55 and end member 61 to sustain the increased mechanical and thermal loads associated with improved crystal pullers and crystal growth processes is substantially increased. Moreover, in prior art cable assemblies, the shank and end member were constructed of a malleable material having a lower creep rupture strength than the tungsten cable, which made the shank and end member the limiting factor in the usage lifetime of the cable assembly. In the cable assembly 21 of the present invention, only the added coupling 57 is constructed of a malleable material. Since the coupling 57 is located intermediate the cable 51 and the shank 55, the coupling is at all times substantially further above the source of molten silicon material M than the tungsten shank and end member 61. As such, the malleable material from which the coupling 57 is constructed is subjected to a cooler thermal environment than the shank and end member of the prior art cable assembly during growth of the ingot I, thereby substantially increasing the usage lifetime of the present cable assembly. Substantially lengthening the shank 55 (e.g., to 10 or more inches) places the coupling 57 even further above the molten source material M, thus subjecting the coupling to a substantially cooler thermal environment.

Constructing the enlarged end member 61 to be generally cylindrical increases the overall length of the end member, thereby extending it down further within the insert 73 to stabilize the insert against movement on the end member. Providing a relief notch 89 within the insert 73 opposite the slot 87 defines a symmetric, or coaxial, engagement between the insert and the end member 61. Loads applied to the insert 73 by the weight of the seed chuck 47 and ingot I are thus coaxially transferred to the end member 61, thereby reducing the risk of bending of the shank 55. In addition, providing curved tapered seats 91, 71 on the insert 73 and end member 61 create more predictable and uniform contact surfaces between the seed chuck adapter 95 and the insert, and between the insert and the end member, respectively. This further promotes a more uniform, or coaxial load transfer from the seed chuck adapter 95 to the chuck support 53 and then to the cable 51.

Finally, providing a monitoring system for monitoring the creep flow or pullout of the various elements of construction of the present cable assembly 21 allows the operator to intermittently measure the creep flow or pullout of the elements between ingot growth cycles. This helps the operator to better determine when a cable assembly 21 is relatively near failure and should be replaced. Such a feature is particularly important when use of a new type of cable assembly 21 such as that of the present invention is initiated because the usage lifetime cannot be sufficiently estimated until a substantial amount of test data has been accumulated. Intermittent monitoring of the creep flow or pullout of the cable assembly 21 could be recorded and later used to predict statistically the minimum safe usage lifetime of the cable assembly. Subsequent cable assemblies could then be replaced prior to reaching this minimum safe usage lifetime to insure than no cable assembly failures will occur.

As various changes could be made in the above construction and method without departing from the scope of the invention, it is intended that all matter contained in the above description or shown in the accompanying drawings shall be interpreted as illustrative and not in a limiting sense.

What is claimed is:

1. A cable assembly for supporting a seed chuck in a crystal puller to grow monocrystalline ingots according to the Czochralski method, the seed chuck being adapted for holding a seed crystal therein; the cable assembly being for use in lowering the seed crystal into a source of molten material disposed in the crystal puller to initiate growth of a silicon ingot and raising the growing ingot upward from the molten source material within the crystal puller, the cable assembly comprising:

a cable adapted for generally vertical movement within the crystal puller relative to the molten source material;

a chuck support connected to an end of the cable within the crystal puller, the chuck support being configured for supporting the seed chuck, said chuck support being constructed of a refractory material having a high creep rupture strength, the chuck support comprising an elongate shank having an upper end and a lower end and an enlarged end member at the lower end of the shank; and a coupling constructed of a malleable material and being deformable into engagement with said one end of the cable and the upper end of the shank to join the chuck support to the cable, the elongate shank spacing the coupling from the enlarged end member of the chuck support so that during operation of the crystal puller the coupling is substantially further above the molten source material than the chuck support as the cable assembly pulls the growing ingot upward within the crystal puller.

2. A cable assembly as set forth in claim 1 wherein the shank and end member are constructed of a refractory metal having a high creep rupture strength.

3. A cable assembly as set forth in claim 2 wherein the shank and end member are constructed of substantially pure tungsten.

4. A cable assembly as forth in claim 1 wherein the elongate shank of the chuck support is at least 10 inches in length.

5. A cable assembly as set forth in claim 1 wherein the enlarged end member of the chuck support is generally cylindrical, the end member having a diameter greater than the diameter of the shank.

6. A cable assembly as set forth in claim 5 wherein the end member has a generally frusto-conical upper end connected to the lower end of the shank and defining a tapered seat for seating an insert used in supporting the seed chuck on the chuck support.

7. A cable assembly as set forth in claim 6 wherein the tapered seat is curved to provide some self-alignment of the insert and seed chuck on the enlarged end member, said curved tapered seat further providing substantially uniform surface area contact between the insert and the enlarged end member to promote uniform distribution of loads transferred from the insert to the chuck support.

8. A cable assembly as set forth in claim 1 wherein the coupling is swaged to the cable.

9. A cable assembly as set forth in claim 8 wherein the coupling is further swaged to the shank of the chuck support.

10. A cable assembly as set forth in claim 1 further comprising an insert sized for seating down over the enlarged end member of the chuck support, said insert being configured for supporting the seed chuck whereby loads applied to the insert by the weight of the seed chuck and growing ingot are transferred to the enlarged end member of the chuck support, the insert being generally cup-shaped and having an open lower end and an upper end having an opening for throughpassage of the lower end of the shank when the insert is seated on the end member, the insert further having a slot extending longitudinally therein substantially from the lower end of the insert to the opening at the upper end of the insert and a relief notch adjacent the opening in opposed relationship with the slot, said notch having a width substantially equal to the width of the slot to promote a generally co-axial load transfer from the insert to the enlarged end member of the chuck support.

11. A cable assembly as set forth in claim 1 further comprising a system for monitoring axial deformation of the cable assembly, the system comprising an annular groove in the shank, the groove being disposed at a predetermined distance intermediate the upper end of the shank and the enlarged end member such that subsequent axial deformation of the cable assembly is monitored by measuring the distance between the groove and the upper end of the shank and comparing said measured distance to the predetermined distance.

12. A cable assembly as set forth in claim 11 wherein the monitoring system comprises upper and lower grooves in longitudinally spaced relationship in the shank of the chuck support such that axial deformation of the cable assembly may be monitored between the coupling and the upper groove, between the grooves and between the lower groove and the enlarged end member of the chuck support.

13. A cable assembly as set forth in claim 12 wherein the monitoring system further comprises a collar swaged to the cable at a predetermined distance above the coupling for monitoring the distance between the collar and the coupling to monitor pullout of the cable from the coupling.

\* \* \* \* \*